United States Patent
Sugiyama

[11] Patent Number: 6,136,628
[45] Date of Patent: Oct. 24, 2000

[54] METHOD FOR FABRICATING PHOTODETECTOR

[75] Inventor: Mitsuhiro Sugiyama, Tokyo, Japan

[73] Assignee: NEC Corporation, Tokyo, Japan

[21] Appl. No.: 09/047,412

[22] Filed: Mar. 25, 1998

[30] Foreign Application Priority Data

Mar. 26, 1997 [JP] Japan .................................. 9-073385

[51] Int. Cl.[7] .............................................. H01L 21/265
[52] U.S. Cl. ........................... 438/48; 438/57; 438/526
[58] Field of Search .............................. 438/48, 57, 91, 438/93, 94, 510, 514, 524, 526; 257/461, 463, 464, 466, 439, 186

[56] References Cited

U.S. PATENT DOCUMENTS

| | | | |
|---|---|---|---|
| 4,104,085 | 8/1978 | Zandveld | 438/91 |
| 4,968,634 | 11/1990 | Kuhlmann | 438/57 |
| 5,157,473 | 10/1992 | Okazaki | 257/461 |
| 5,262,667 | 11/1993 | Hirai | 257/466 |
| 5,424,222 | 6/1995 | Arndt | 438/514 |
| 5,576,221 | 11/1996 | Takemura et al. | 438/57 |
| 5,726,440 | 3/1998 | Kalkhoran et al. | 257/464 |
| 5,731,622 | 3/1998 | Sugiwama et al. | 257/466 |
| 5,796,118 | 8/1998 | Morikawa et al. | 257/19 |
| 5,942,789 | 8/1999 | Morikawa | 257/462 |

FOREIGN PATENT DOCUMENTS

| | | | |
|---|---|---|---|
| 59-112664 | 6/1984 | Japan . | |
| 3-286567 | 12/1991 | Japan . | |
| 6-151942 | 5/1994 | Japan | 257/186 |
| 7-231113 | 8/1995 | Japan . | |
| 8-316449 | 11/1996 | Japan . | |

OTHER PUBLICATIONS

M. Sugiyama et al., "A Selective Epitaxial SiGe/Si Planar Photodetector for Si–based OEICs", IEEE 1995, pp. 22.7.1–11.7.4.

H. Temkin et al., "$Ge_{0.6}Si_{0.4}$ Rib Wavelength Avalanche Photodetectors for 1.3$\mu$m Operation", Applied Physics Letters 49(13), Sep. 29, 1986 pp. 809–811.

*Primary Examiner*—Savitri Mulpuri
*Attorney, Agent, or Firm*—Young & Thompson

[57] ABSTRACT

It has been pointed out that the avalanche breakdown voltage of a photodetector comprising an avalanche layer formed by selective epitaxial growth considerably fluctuates. A $N^+$—Si buried layer and a N—Si epitaxial layer 3 are successively formed on a P—Si substrate. A cavity is formed in the N—Si epitaxial layer, and a $SiO_2$ layer is grown in the empty space of the cavity. Then, the $SiO_2$ layer is etched by dry etching, and a $SiO_2$ layer is left behind on the side wall of the cavity. Next, a P—Si diffusion layer (an avalanche layer) is formed on the $N^+$—Si buried layer by P ion implantation. Subsequently, A SiGe/Si layer (an absorption layer) is selectively grown, and a $P^+$—Si layer (an electrode layer) is selectively grown thereon.

4 Claims, 4 Drawing Sheets

- 10 INSULATOR BARRIER
- 3 N-Si EPITAXIAL LAYER
- 2 N+-Si BURRIED LAYER
- 1 P-Si SUBSTRATE

- 8 P+-Si (ELECTRODE) LAYER
- 7 SiGe/Si (ABSORPTION) LAYER
- 11 P-Si EPITAXIAL (AVALANCHE) LAYER

METHOD FOR FABRICATING PHOTODETECTOR

FIELD OF THE INVENTION

The invention relates to a method for fabricating a photodetector, and especially to a method for fabricating an avalanche photodiode, which is produced by selectively forming an avalanche layer and an absorption layer on a Si substrate.

BACKGROUND OF THE INVENTION

Roughly explaining, a conventional method for fabricating a photodetector provided with an avalanche layer comprises the steps of forming a $N^+$—Si buried layer on a P—Si substrate, forming a N—Si layer (an avalanche layer), forming a SiGe/Si layer (an absorption layer), and forming a $P^+$—Si layer (an electrode layer) by a chemical vapor deposition (CVD) method. According to the latest research made by the present inventors on the photodetector provided with the avalanche layer, the avalanche breakdown voltage is supersensitive for the impurity concentration of the avalanche layer of the photodetector, and it is indispensable to control the impurity concentration with high accuracy in order to stabilize the characteristics of the photodetector. However, the impurity concentration of the epitaxial layer is apt to fluctuate in most cases, and it is extremely desirable to develop a method for forming the avalanche layer of the photodiode, by which the fluctuations of the impurity concentration can be suppressed.

SUMMARY OF THE INVENTION

Accordingly, it is an object of the invention to provide a method for fabricating a photodetector, an avalanche breakdown voltage of which does not fluctuate by forming an avalanche layer by ion implantation.

It is a further object of the invention to provide a method for fabricating a photodetector, an avalanche breakdown voltage of which does not fluctuate by forming an avalanche layer by ion implantation without damaging an ion implanted layer.

It is a still further object of the invention to provide a method for fabricating a photodetector, an avalanche breakdown voltage of which does not fluctuate by forming an avalanche layer by ion implantation decreasing the steps of fabrication process and without damaging the ion-implanted layer.

According to the first feature of the invention, a method for fabricating a photodetector comprises the steps of:

successively forming a Si buried layer of a second conductivity type and a Si layer of the second conductivity type on a Si substrate of a first conductivity type, forming a cavity having a side wall covered with a $SiO_2$ layer in the Si layer of the second conductivity type at least, forming a Si diffusion layer of the first conductivity type on the Si buried layer of the second conductivity type or a part of the Si layer of the second conductivity type at least by selectively introducing impurity of the first conductivity type by ion implantation, and selectively forming a single crystal layer or selectively and alternately forming alloy layers and single crystal layers on the Si diffusion layer of the first conductivity type.

According to the second feature of the invention, a method for fabricating a photodetector comprises the steps of:

successively forming a Si buried layer of a second conductivity type and a Si layer of the second conductivity type on a Si substrate of a first conductivity type, forming a cavity having a side wall covered with a first $SiO_2$ layer in the Si layer of the second conductivity type at least, forming a second $SiO_2$ layer covering a top surface of the Si layer of the second conductivity type and an inner surface of the cavity, forming a Si diffusion layer of the first conductivity type on the Si buried layer of the second conductivity type or a part of the Si layer of the second conductivity type at least by selectively introducing impurity of the first conductivity type by ion implantation through the second $SiO_2$ layer, removing the second $SiO_2$ layer, and selectively forming a single crystal layer or selectively and alternately forming single crystal layers and alloy layers.

According to the third feature of the invention, a method for fabricating a photodetector comprises the steps of:

successively forming a Si buried layer of a second conductivity type and a Si layer of said second conductivity type on a Si substrate of a first conductivity type, forming a cavity in the Si layer of second conductivity type at least, forming a $SiO_2$ layer covering a top surface of the Si layer of the second conductivity type and an inner surface of the cavity, forming a diffusion layer of the first conductivity type on the Si buried layer of the second conductivity type or a part of the Si layer of the second conductivity type at least by selectively introducing impurity of the first conductivity type by ion implantation through the $SiO_2$ layer, leaving the $SiO_2$ layer behind only on a side wall of the cavity by removing parts of the $SiO_2$ layer, and selectively forming a single crystal layer or selectively and alternately forming single crystal layers and alloy layers on the diffusion layer of the first conductivity type.

BRIEF DESCRIPTION OF THE DRAWINGS

The invention will be explained in more detail in conjunction with the appended drawings, wherein.

DESCRIPTION OF THE PREFERRED EMBODIMENTS

Before explaining a method for fabricating a photodetector in the preferred embodiment according to the invention, the aforementioned conventional methods for fabricating the photodetector will be explained.

A method for fabricating a photodetector disclosed in Japanese Patent Kokai No. 7-23113, which was proposed by the present inventors, will be explained referring to FIGS. 1A to 1C as the first example of conventional technologies.

Figure 1A:
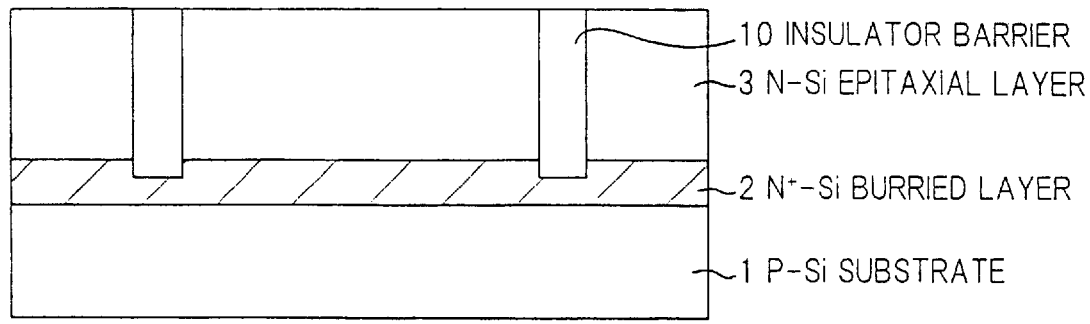
FIGS. 1A to 1C are cross-sectional views of a semiconductor chip for explaining the first conventional technology.
Figure 1B:
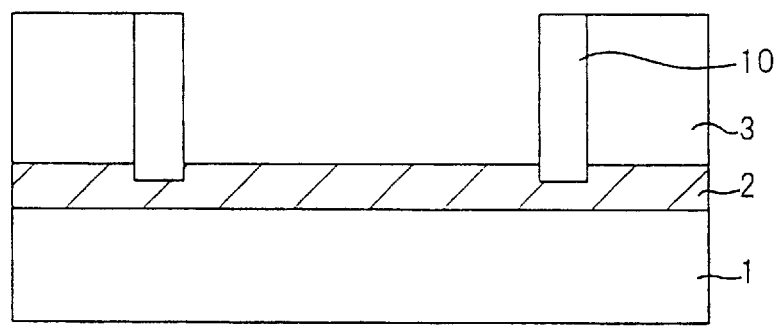
Figure 1C:
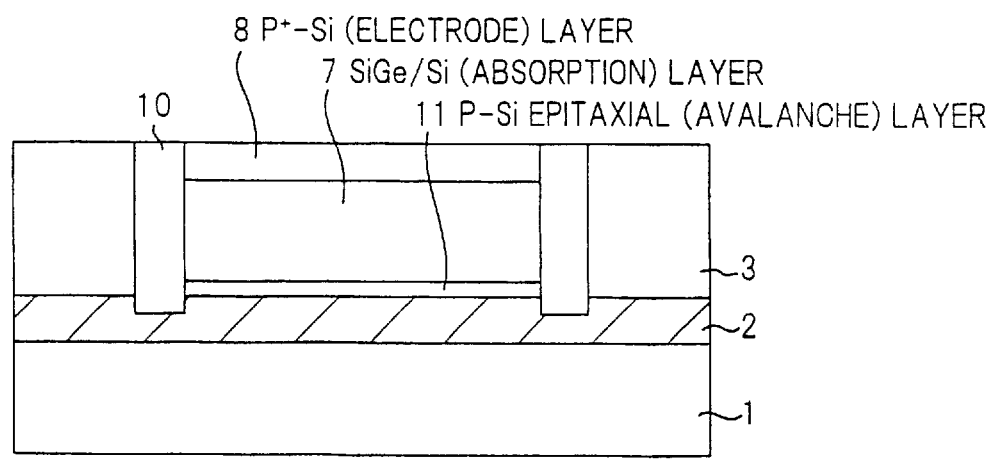

First, as shown in FIG. 1A, a N$^+$—Si buried layer 2 is formed on a P—Si substrate 1, and a N—Si epitaxial layer 3 is deposited thereon. Next, an insulator barrier 10 made of SiO$_2$ is formed in the N—Si epitaxial layer 3, till its bottom surface reaches the N$^+$—Si buried layer 2. Next, as shown in FIG. 1B, the N—Si epitaxial layer 3 surrounded by the insulator barrier 10 is removed. Subsequently, as shown in FIG. 1C, in an empty space surrounded by the side wall of the insulator barrier 10, a P—Si layer (an avalanche layer) 11 is formed by selective epitaxial growth, then, a SiGe/Si layer (an absorption layer) 7, which is produced by selective and alternate epitaxial growth of SiGe-alloy layers and Si single crystal layers is formed thereon, and finally, a P$^+$—Si layer (an electrode layer) 8 is selectively grown thereon.

Figure 2A:
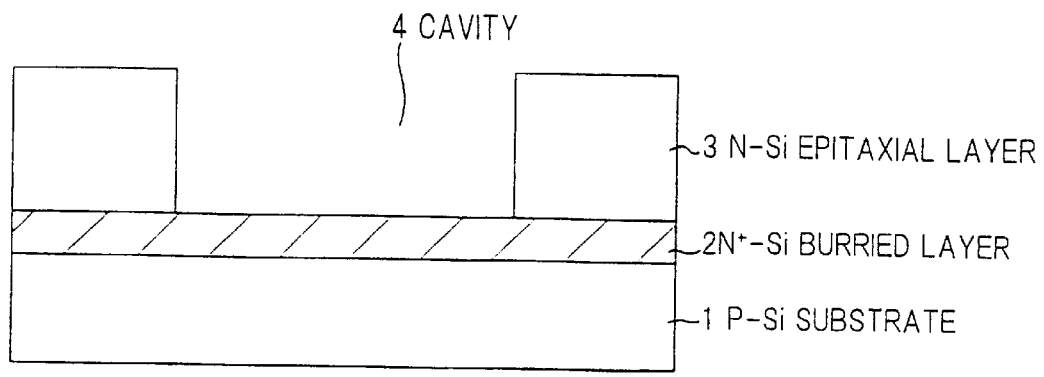
FIGS. 2A to 2C are cross-sectional views of a semiconductor chip for explaining the second conventional technology.
Figure 2B:
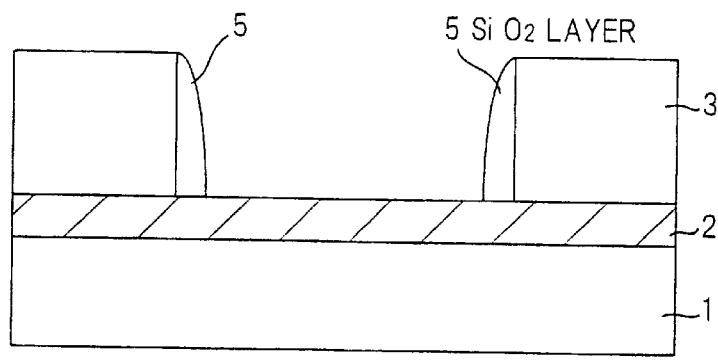
Figure 2C:
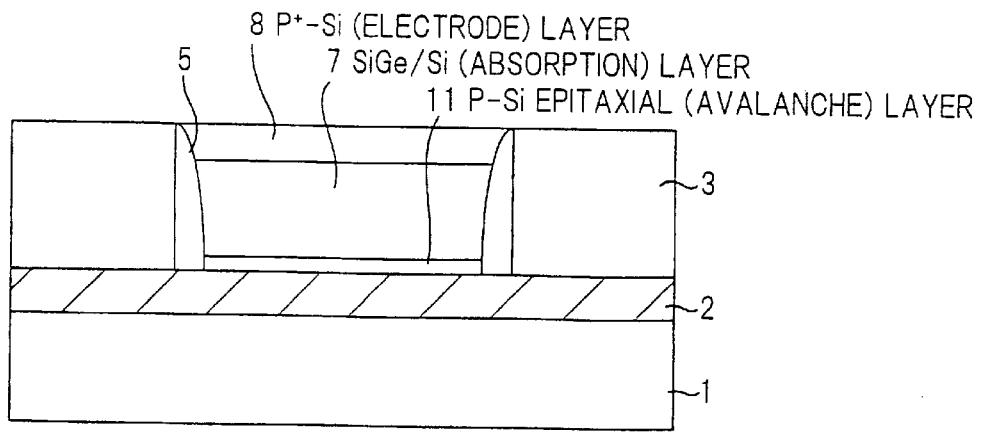

The second conventional technology will be explained in regular sequence of fabrication process referring to FIGS. 2A to 2C. First, as shown in FIG. 2A, after successively growing a N$^+$—Si buried layer 2 and a N—Si epitaxial layer 3 on a P—Si substrate 1, a cavity 4 is formed so that its bottom surface reaches the N$^+$—Si buried layer 2. Next, as shown in FIG. 2B, a SiO$_2$ layer is formed so that it covers the whole surfaces of the N—Si epitaxial layer 3 and the N$^+$—Si buried layer 2, and then, the SiO$_2$ layer is etched back by a dry etching method so that a SiO$_2$ layer 5 is left behind on the side surface of the cavity 4. Thereafter, as shown in FIG. 2C, a P—Si layer (an avalanche layer) 11 is formed by selective epitaxial growth, then, a SiGe/Si layer (an absorption layer) 7, which is produced by alternate and selective epitaxial growth of SiGe-alloy layers and Si single crystal layers, is grown thereon, and finally, a P$^+$—Si layer (an electrode layer) 8 is grown.

In the aforementioned methods for fabricating the photodetector, an avalanche layer is formed by the method of selective epitaxial growth. In these methods, impurity is added during epitaxial growth. The inventors investigate a relation between the avalanche breakdown voltage of the PN junction of the photodetector and impurity concentration of the avalanche layer by computer simulation, and find that the avalanche breakdown voltage of the PN junction of the photodetector changes by 30%, if impurity concentration changes by 5%. In order to keep the fluctuations of the avalanche breakdown voltage within 10% to meet the requirement of mass production of the photodetector, it is necessary to suppress the fluctuations of impurity concentration within about 2%.

However, in the case of epitaxial growth, in which dopant gas is added to source gas, control of impurity concentration in an epitaxial layer is difficult as compared with the case of ion implantation, which is frequently used for controlling impurity concentration of a semiconductor. Explaining concretely, in the case of epitaxial growth, the fluctuations of impurity concentration of 10% are inevitable. Accordingly, it seems to be unrealizable to form the avalanche layer by epitaxial growth from the view point of the fluctuations of characteristics of the avalanche photodiode.

Figure 3A:
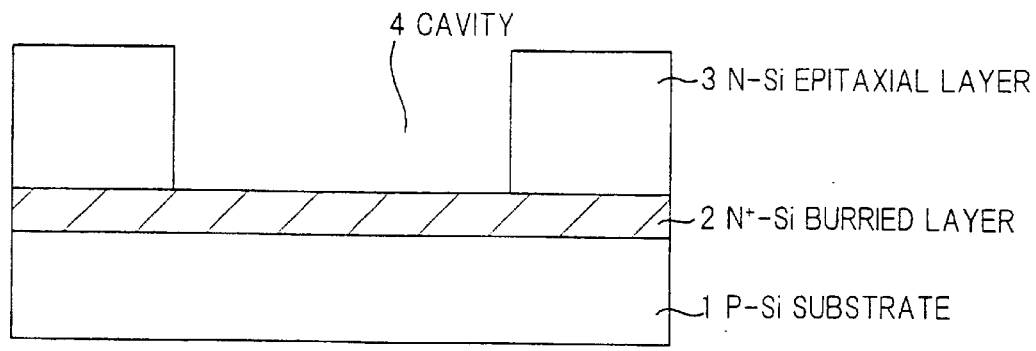
FIGS. 3A to 3C, are cross-sectional views of a semiconductor chip for explaining the first preferred embodiment of the invention, FIGS. 4A to 4B cross-sectional views of a semiconductor chip for explaining the second preferred embodiment of the invention.
Figure 3B:
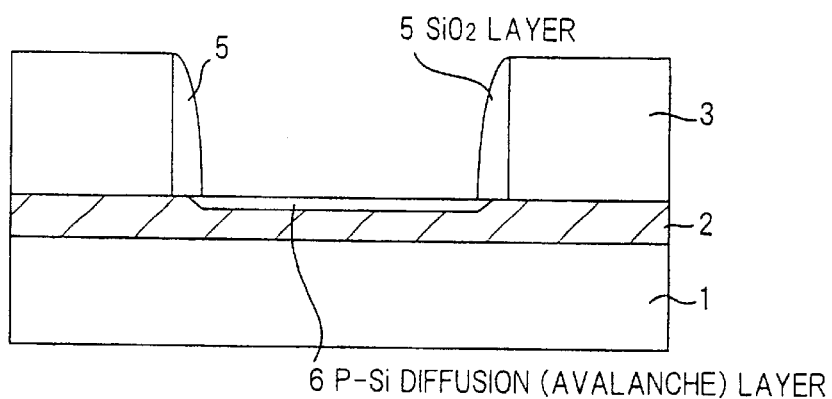
Figure 3C:
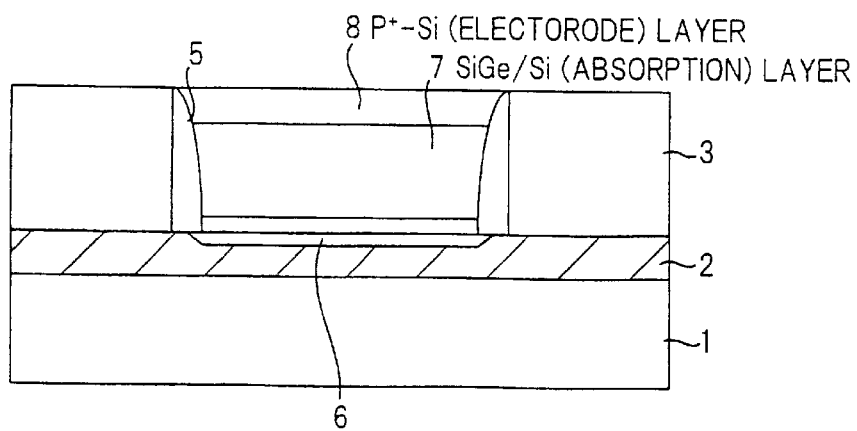

Next, the invention will be explained referring to the appended drawings. FIGS. 3A to 3C are cross-sectional views of a semiconductor chip for explaining the first preferred embodiment of the invention in regular sequence of its fabrication process.

First, as shown in FIG. 3A, a 0.8 $\mu$m thick N$^+$—Si buried layer 2 is formed on a 1 $\mu$m thick P—Si substrate 1, a 1 $\mu$m thick N—Si epitaxial layer 3 is deposited thereon, and a 1 $\mu$m deep cavity 4 is formed in the N—Si epitaxial layer 3.

Next, as shown in FIG. 3B, after a 0.2 $\mu$m thick SiO$_2$ layer is formed on the whole inner surface of the cavity 4 and the top surface of the N—Si epitaxial layer 3, the SiO$_2$ layer is etched back by a dry etching method, and a SiO$_2$ layer 5 is left behind on the side wall of the cavity 4. Next, P ions are implanted on condition that implant energy and dose amount are respectively 10 KeV and 1×10$^{13}$ cm$^{-2}$, and a P—Si diffusion layer (an avalanche layer) 6 is formed on the N$^+$—Si buried layer 2. Then, it is necessary to activate the P—Si diffusion layer 6 by a thermal treatment. The thermal treatment should be carried out at 900° C. for 1 min by rapid thermal anneal in order to avoid the situation that the depth of the diffusion layer exceeds a desired value.

Next, as shown in FIG. 3C, a SiGe/Si layer (an absorption layer) 7, which is produced by atternate and selective epitaxial growth of SiGe-alloy layer and Si single crystal layers, is formed in the cavity 4, and a 0.1 $\mu$m thick P$^+$—Si layer (an electrode layer) 8 is selectively grown thereon.

The depths of the N—Si epitaxial layer 3 and the cavity 4 can be suitably selected according to the required depth of the absorption layer 7, which arises no influence on the process of the embodiment of the invention. Moreover, in the embodiment shown in FIGS. 3A to 3C, the cavity 4 is so formed that it reaches the N$^+$—Si buried layer 2, but the effect of the invention is never affected in case that the cavity 4 does not reach the N$^+$—Si buried layer 2. The depth of the cavity 4 can be suitably selected according to a use of the photodiode or later steps of a fabrication process.

As mentioned in the above, since the P—Si diffusion layer 6 is formed by the method of ion implantation, the fluctuations of impurity concentration can be suppressed.

Figure 4A:
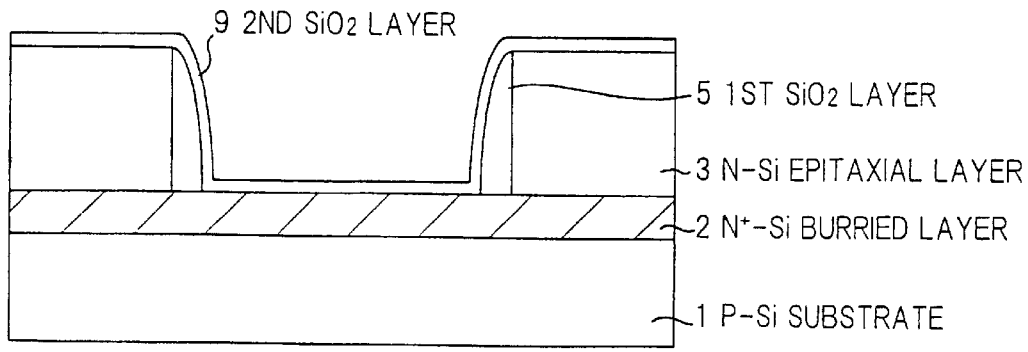
Figure 4B:
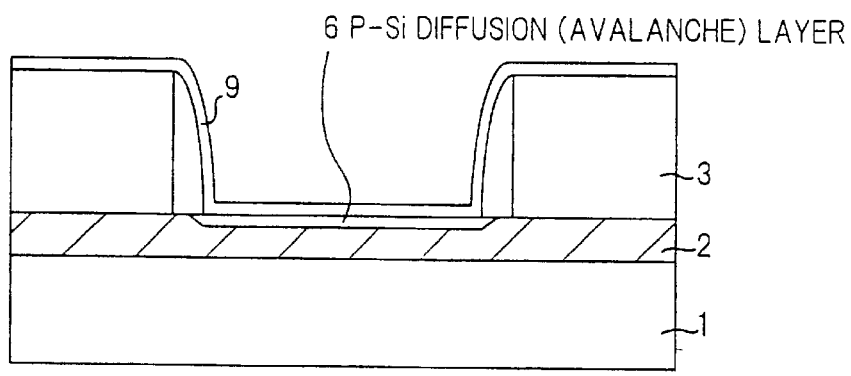

FIGS. 4A to 4B are cross-sectional views of a semiconductor chip for explaining the second preferred embodiment of the invention.

The steps of the fabrication process of a photodector according to the second preferred embodiment are the same as those according to the first preferred embodiment till a cavity 4 shown in FIG. 3A is formed. Subsequently, after a SiO$_2$ layer is formed so that it covers the whole inner surface of the cavity 4 and the top surface of the N—Si epitaxial layer 3, the SiO$_2$ layer is etched back by a dry etching method, and the SiO$_2$ layer 5 is left behind on the side surface of the cavity 4 as shown in FIG. 4A. Then, a 0.03 $\mu$m thick SiO$_2$ layer 9 is formed over the whole surfaces of the N—Si epitaxial layer 3, a SiO$_2$ layer 5 and the N$^+$—Si buried layer 2.

Next, as shown in FIG. 4B, a P—Si diffusion layer (an avalanche layer) 6 is formed by P ion implantation on condition that implant energy and dose amount are respectively 50 KeV and 1×10$^{13}$ cm$^{-2}$. Subsequently, the SiO$_2$ buffer layer 9 is removed, a SiGe/Si layer (an absorption layer) 7, which is produced by alternate and selective epitaxial growth of SiGe-alloy layers and Si single crystal layers, is formed, and a P$^+$—Si layer (an electrode layer) 8 is formed thereon similarly to the case of FIG. 3C in the first preferred embodiment. In the second preferred embodiment, since P ions are implanted through the SiO$_2$ buffer layer 9 in order to obtain the P—Si diffusion layer 6, defaults on the P—Si diffusion layer 6 can be decreased as compared with the case, where P ions are directly implanted on the N$^+$—Si buried layer 2.

Figure 5:
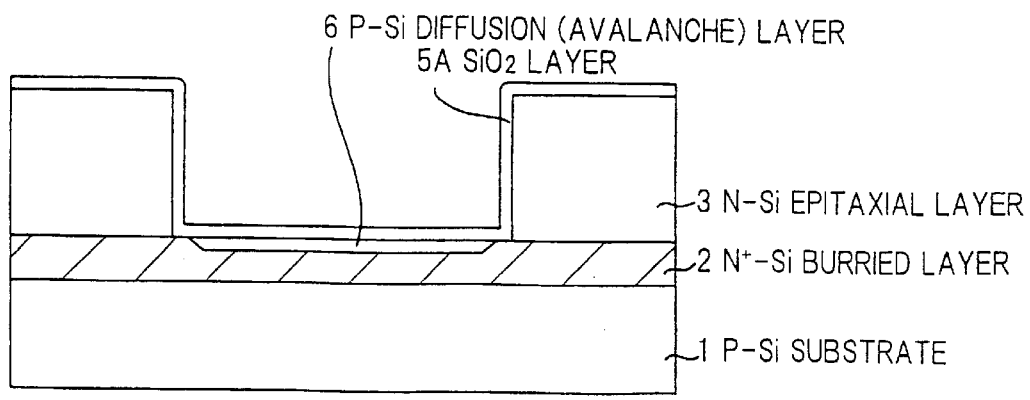
FIG. 5 is a cross-sectional view of a semiconductor chip for explaining the third preferred embodiment of the invention.

FIG. 5 is the cross-sectional view of a semiconductor chip for explaining the third preferred embodiment of the invention. The steps of fabrication process of a semiconductor chip are the same as those of the first preferred embodiment till a configuration shown in FIG. 3A obtained. Subsequently, a 0.2 μm thick $SiO_2$ layer 5A is formed over the whole surfaces of a N—Si epitaxial layer 3, the side wall of the cavity 4 and a $N^+$—Si buried layer 2 as shown in FIG. 5. Next, a P—Si diffusion layer (an avalanche layer) 6 is formed by P ion implantation on condition that implant energy and dose amount are respectively 210 KeV and $2 \times 10^{13}$ $cm^{-2}$. Next, the $SiO_2$ layer 5A is etched back by dry etching method, and a $SiO_2$ layer 5A is left behind on the side wall of the cavity 4 similarly the case of FIG. 3B in the first preferred embodiment.

Thereafter, similarly to the case of FIG. 3C, a SiGe/Si layer (an absorption layer) 7, which is produced by alternate and selective epitaxial growth of SiGe-ally layers and Si single crystal layers, is formed, and a $P^+$—Si layer (an electrode layer) is selectively grown thereon. In the third preferred embodiment, since P ions are implanted through a $SiO_2$ layer 5A, defaults on the P—Si diffusion layer 6 can be degreased. Moreover, the $SiO_2$ layer 5A left behind in the cavity serves as a buffer layer in the case of ion implantation, hence the steps in the fabrication process can be decreased as compared with the first preferred embodiment.

The absorption layer is never restricted to the SiGe/Si layer, and a semiconductor layer of other kind can be employed according to the wavelength of a light signal to be received. The aforementioned SiGe/Si layer is suited for receiving a light with a wavelength longer than 1.0 μm, i.e. the light in the so called long wavelength band. However, when the wavelength of the light to be received is shorter than 0.8 μm, a Si single crystal layer can be employed, that is to say, the Si single crystal layer produced by selective epitaxial growth can be adopted instead of the SiGe/Si layer.

According to the aforementioned embodiments of the invention comprising the steps of forming the avalanche layer by ion implantation, the avalanche layer, in which fluctuation of impurity concentration can be suppressed within a range of 2%, can be formed bordering on the absorption layer of the avalanche photodiode.

As mentioned in the above, in the method for fabricating a semiconductor photodector according to the invention, since the avalanche layer is formed by the method of ion implantation, fluctuation of impurity concentration in the avalanche layer can be decreased as compared with the photodector fabricated by the conventional method. Accordingly, fluctuation of the avalanche breakdown voltage caused by imperfection of the fabrication process can be decreased, and the photodector comprising the avalanche layer can be fabricated securing stability.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is that:

1. A method for fabricating a photodetector comprising the steps of:

successively forming a Si buried layer of a second conductivity type and a Si layer of said second conductivity type on a Si substrate of a first conductivity type, forming a cavity having a side wall covered with a first $SiO_2$ layer in said Si layer of said second conductivity type at least, forming a second $SiO_2$ layer covering a top surface of said Si layer of said second conductivity type and an inner surface of said cavity, forming a Si diffusion layer of said first conductivity type on said Si buried layer of said second conductivity type or a part of said Si layer of said second conductivity type at least by selectively introducing impurity of said first conductivity type by ion implantation through said second $SiO_2$ layer, removing said second $SiO_2$ layer, and selectively forming a single crystal layer or selectively and alternately forming single crystal layers and alloy layers on said Si diffusion layer of said first conductivity type.

2. A method for fabricating a photodetector according to claim 1, wherein:

said step of forming said cavity comprises the step of forming said cavity having a bottom to expose said Si buried layer.

3. A method for fabricating a photodetector according to claim 1, wherein:

said step of forming said cavity comprises the step of forming said cavity having a bottom to cover said Si buried layer.

4. A method for fabricating a photodetector according to claim 1, wherein:

said step of forming said cavity comprises the steps of forming a cavity in said Si layer, covering a top surface of said first Si layer of said second conductivity type and an inner surface of said cavity with said $SiO_2$ layer, and removing part of said $SiO_2$ layer except on said side wall of said cavity by means of dry etching.

* * * * *